(12) United States Patent
Park

(10) Patent No.: US 10,746,805 B2
(45) Date of Patent: Aug. 18, 2020

(54) CONTROL METHOD AND SYSTEM FOR MONITORING DETERIORATION OF BATTERY OF VEHICLE

(71) Applicants: Hyundai Motor Company, Seoul (KR); Kia Motors Corporation, Seoul (KR)

(72) Inventor: Hyun Soo Park, Anyang-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 233 days.

(21) Appl. No.: 16/007,882

(22) Filed: Jun. 13, 2018

(65) Prior Publication Data

US 2019/0178949 A1    Jun. 13, 2019

(30) Foreign Application Priority Data

Dec. 12, 2017    (KR) .................. 10-2017-0170810

(51) Int. Cl.
| | |
|---|---|
| G01R 31/392 | (2019.01) |
| G01R 31/00 | (2006.01) |
| H02J 7/14 | (2006.01) |
| G01R 31/36 | (2020.01) |
| H02J 7/00 | (2006.01) |
| B60L 58/16 | (2019.01) |

(52) U.S. Cl.
CPC ............ *G01R 31/392* (2019.01); *B60L 58/16* (2019.02); *G01R 31/005* (2013.01); *G01R 31/3648* (2013.01); *H02J 7/0047* (2013.01); *H02J 7/1461* (2013.01)

(58) Field of Classification Search
CPC .......... B60L 58/12; B60L 58/13; B60L 58/14; B60L 58/15; B60L 58/16; G01R 31/006; G01R 31/36; G01R 31/382; G01R 31/392
See application file for complete search history.

(56) References Cited

U.S. PATENT DOCUMENTS

| 10,000,202 | B2 * | 6/2018 | Park ...................... B60W 10/06 |
| 10,614,146 | B2 * | 4/2020 | Song ......................... H02J 3/00 |
| 10,661,857 | B2 * | 5/2020 | Takatsuka ............... B60L 50/20 |
| 2014/0176085 | A1 * | 6/2014 | Maruno .................. B60L 58/16 |
| | | | 320/162 |

(Continued)

FOREIGN PATENT DOCUMENTS

KR    10-2015-0022345 A    3/2015

*Primary Examiner* — Steven L Yeninas

(74) *Attorney, Agent, or Firm* — Morgan, Lewis & Bockius LLP

(57) ABSTRACT

A control method of monitoring deterioration of a battery of a vehicle, may include determining, by a controller, whether an entry condition of allowing an entry to a deterioration monitoring mode of the battery is satisfied; setting, by the controller, a deterioration monitoring condition when the entry condition of allowing the entry to the deterioration monitoring mode of the battery is satisfied; performing, by the controller, charging of the battery after the setting of the deterioration monitoring condition is completed; and stopping, by the controller, the charging and determining a deterioration rate of the battery when a first state of charge (SOC) value of the battery is greater than a predetermined first reference value as a result of the performing charging.

14 Claims, 3 Drawing Sheets

(56) References Cited

U.S. PATENT DOCUMENTS

| | | | |
|---|---|---|---|
| 2014/0184233 A1* | 7/2014 | Nam | G01R 31/392 324/426 |
| 2015/0057957 A1* | 2/2015 | Kim | G01R 31/392 702/63 |
| 2016/0001766 A1* | 1/2016 | Mori | B60W 20/13 701/22 |
| 2017/0254853 A1* | 9/2017 | Imamura | H01M 10/48 |
| 2018/0128880 A1* | 5/2018 | Miyamoto | H01M 10/44 |
| 2018/0326862 A1* | 11/2018 | Woo | B60L 1/003 |

\* cited by examiner

CONTROL METHOD AND SYSTEM FOR MONITORING DETERIORATION OF BATTERY OF VEHICLE

CROSS REFERENCE TO RELATED APPLICATION

The present application claims priority to Korean Patent Application No. 10-2017-0170810, filed Dec. 12, 2017, the entire contents of which is incorporated herein for all purposes by this reference.

BACKGROUND OF THE INVENTION

Field of the Invention

The present invention relates generally to a control method and system for monitoring deterioration of a battery of a vehicle. More particularly, the present invention relates to a control method and system for monitoring deterioration of a battery of a vehicle, in which deterioration monitoring is possible without provision of an external charging device due to performing of charging and discharging by use of a motor, and an entry condition for performing the deterioration monitoring is set without limitations.

Description of Related Art

As well-known in the art, methods of monitoring deterioration of high-voltage batteries of environmentally friendly vehicles such as electric vehicles (EVs), plug-in hybrid electric vehicles (PHEVs), etc. have been developed utilizing voltage behavior under external charging, charge time, etc. As a result, deterioration monitoring is possible only for the EVs and PHEVs, and a charge section that may be monitored is also limited, thereby limiting an entry condition for performing the deterioration monitoring.

In other words, there is a problem in that if a user has a PHEV and charging is hardly performed, or if the charging is performed without including a section required for the deterioration monitoring, the deterioration monitoring is impossible.

Furthermore, in the related art, there is a problem in that when an external charging device is used, a chargeable current of a battery varies depending on the capacity of the charging device and the temperature of the battery, and charging needs to be performed only at the maximum charge current.

Accordingly, there is required a technique of solving the above problems and of facilitating the deterioration monitoring even for a hybrid electric vehicle (HEV) with no external charging function as well as for the EV, and the PHEV.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a control method and system for monitoring deterioration of a battery of a vehicle, in which deterioration monitoring is possible without provision of an external charging device due to performing of charging and discharging by use of a motor, and an entry condition for performing the deterioration monitoring is set without limitations.

In various aspects of the present invention, the control method of monitoring deterioration of a battery of a vehicle, may include determining, by a controller, whether an entry condition of allowing an entry to a deterioration monitoring mode of the battery is satisfied; setting, by the controller, a deterioration monitoring condition when the entry condition of allowing the entry to the deterioration monitoring mode of the battery is satisfied; performing, by the controller, charging of the battery after the setting of the deterioration monitoring condition is completed; and stopping, by the controller, the charging and determining a deterioration rate of the battery when a first state of charge (SOC) value of the battery is greater than a predetermined first reference value as a result of the performing the charging.

In the determining of whether the entry condition of allowing the entry to the deterioration monitoring mode of the battery is satisfied, it is determined, by the controller, whether a driving mode of the vehicle is a mode, in which the vehicle requires an output higher than a predetermined output.

In the determining of whether the entry condition of allowing the entry to the deterioration monitoring mode of the battery is satisfied, when a predetermined time elapses from a previous deterioration monitoring mode entry point, it is determined whether the entry condition of allowing the entry to the deterioration monitoring mode is satisfied.

In the setting of the deterioration monitoring condition, the battery is charged or discharged such that a second state of charge (SOC) value of the battery becomes equal to a second reference value.

When the second SOC value of the battery is not equal to the second SOC reference value, the setting of the deterioration monitoring condition includes: discharging the battery when the second SOC value of the battery is greater than the second SCO reference value; and charging the battery when the second SOC of the battery is less than the second reference value.

The charging of the battery is stopped by the controller and the deterioration rate of the battery is determined when the first SOC value monitored during the charging of the battery is greater than the predetermined first SOC reference value.

The battery is charged and discharged by operating a motor.

In performing the charging of the battery, a required charge current value required in a current battery state is derived based on map data prepared in advance, and the charging of the battery is performed based on the derived required charge current value.

The battery is charged by operating a motor.

In the determining the deterioration rate, the deterioration rate of the battery is determined based on map data prepared in advance, the map data including the deterioration rate as output information and temperature and a state of charge (SOC) of the battery as input information.

The control method may further include deleting a prestored deterioration rate of the battery and storing the determined deterioration rate after the determining the deterioration rate.

In various aspects of the present invention, a control system for monitoring deterioration of a battery of a vehicle, may include the battery mounted in the vehicle and supplying electric power to a motor of the vehicle; the motor operated in a response to a command signal from a controller when the battery is charged and discharged when a deterioration monitoring condition of the battery is set or when the battery is charged after the setting of the deterioration monitoring condition is completed; and the controller configured for determining whether an entry condition of allowing an entry to a deterioration monitoring mode of the battery is satisfied, setting the deterioration monitoring condition by operating the motor when the entry condition of the deterioration monitoring mode of the battery is satisfied, performing charging of the battery by operating the motor after the setting of the deterioration monitoring condition is completed, and stopping the charging and determining a deterioration rate when a first state of charge (SOC) value of the battery is greater than a predetermined first reference value as a result of the performing the charging.

In setting the deterioration monitoring condition, when a second SOC value of the battery is not equal to a second SOC reference value, the controller is configured to discharge the battery when the second SOC value of the battery is greater than the second SOC reference value; and the controller is configured to charge the battery when the second SOC of the battery is less than the second reference value.

In stopping the charging, the charging of the battery is stopped by the controller and the deterioration rate of the battery is determined when the first SOC value monitored during the charging of the battery is greater than the predetermined first SOC reference value.

After determining the deterioration rate, the controller deletes a pre-stored deterioration rate of the battery and stores the determined deterioration rate.

According to the control method and system for monitoring the deterioration of the battery of the vehicle according to an exemplary embodiment of the present invention, the deterioration monitoring is possible without provision of the external charging device due to performing of charging and discharging by use of the motor, and the entry condition for performing the deterioration monitoring may be set without limitations.

In addition, the charge current is adjusted according to the battery SOC, whereby it is possible to improve degree of freedom in deterioration monitoring.

Moreover, it is possible to update the deterioration rate without external charging when replacing a high-voltage battery or a battery management system (BMS) after mass production.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
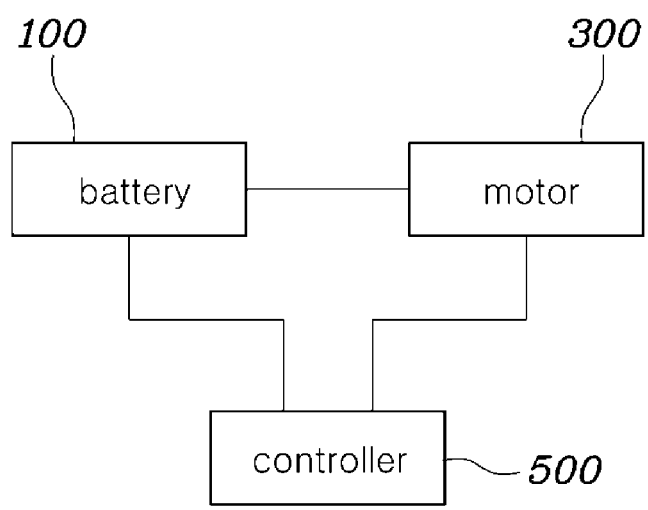
FIG. 1 is a schematic diagram showing a control system for monitoring deterioration of a battery of a vehicle according to an exemplary embodiment of the present invention.

It may be understood that the appended drawings are not necessarily to scale, presenting a somewhat simplified representation of various features illustrative of the basic principles of the invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the other hand, the invention(s) is/are intended to cover not only the exemplary embodiments, but also various alternatives, modifications, equivalents and other embodiments, which may be included within the spirit and scope of the invention as defined by the appended claims.

Hereinbelow, a control method and system for monitoring deterioration of a battery of a vehicle according to exemplary embodiments of the present invention will be described in detail with reference to the accompanying drawings.

Figure 2:
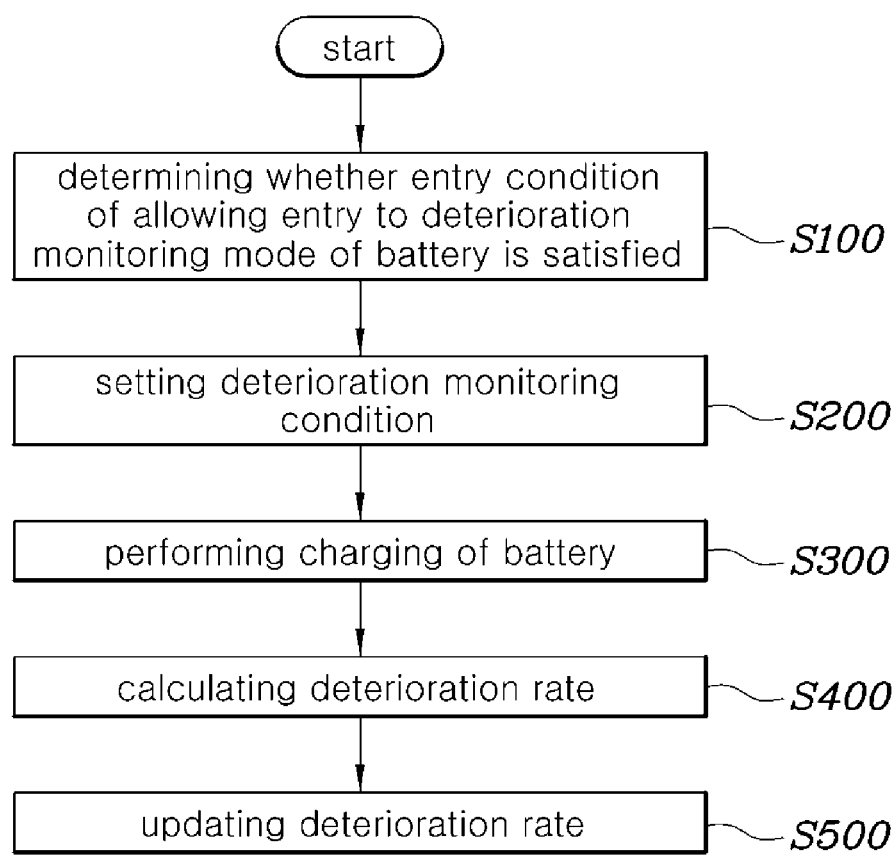
FIG. 2 and FIG. 3 are flowcharts showing a control method of monitoring deterioration of a battery of a vehicle according to an exemplary embodiment of the present invention.
Figure 3:
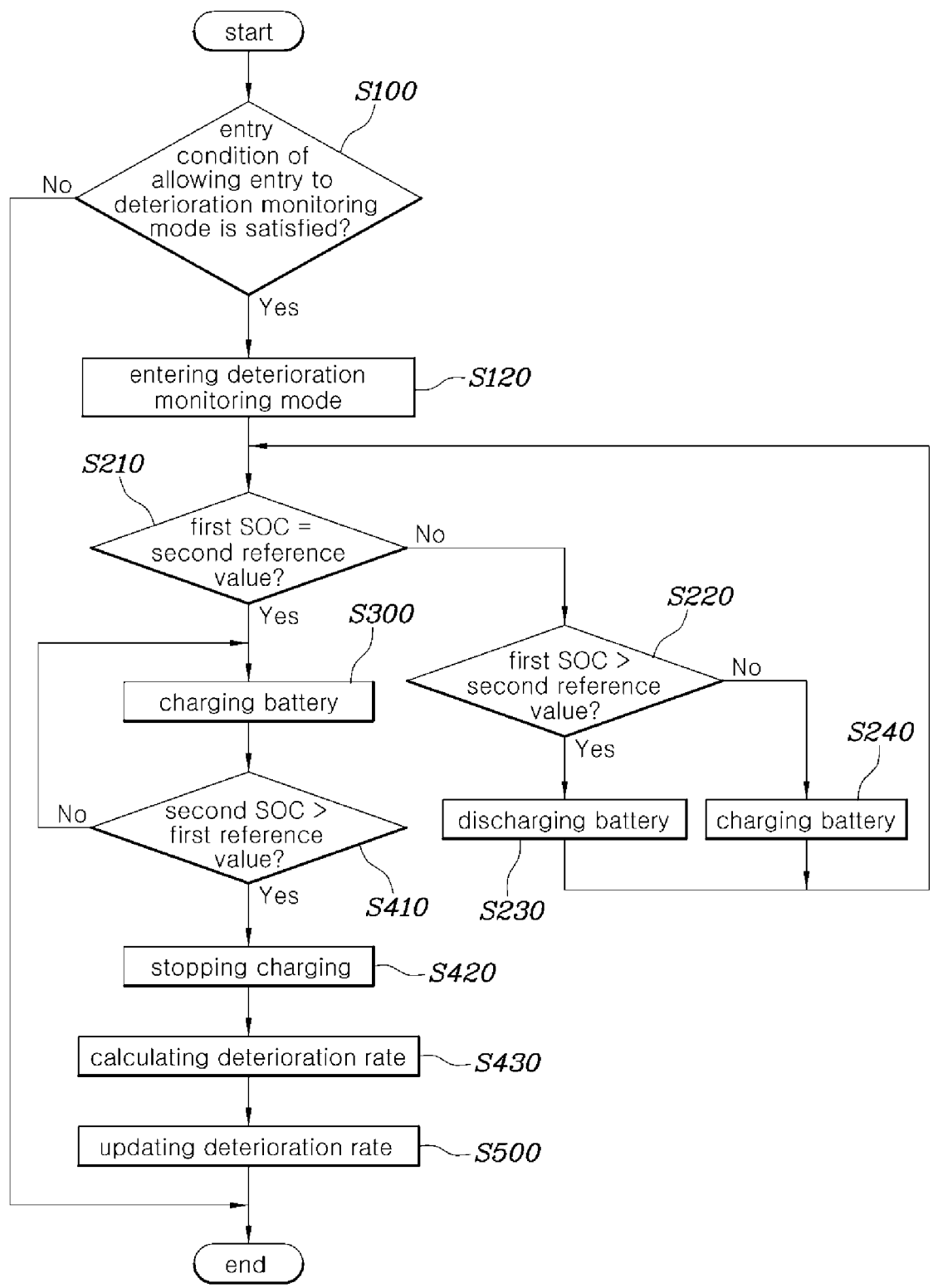

FIG. 1 is a schematic diagram showing a control system for monitoring deterioration of a battery of a vehicle according to an exemplary embodiment of the present invention, and FIG. 2 and FIG. 3 are flowcharts showing a control method of monitoring deterioration of a battery of a vehicle according to an exemplary embodiment of the present invention.

First, referring to FIG. 1, a control system for monitoring deterioration of a battery of a vehicle according to an exemplary embodiment of the present invention may include a battery 100 mounted in a vehicle and supplying electric power to a motor 300 of the vehicle; the motor 300 operated in a response to a command signal from a controller 500 when the battery 100 is charged and discharged when a deterioration monitoring condition of the battery 100 is set or when the battery 100 is charged after the setting of the deterioration monitoring condition is completed; and the controller 500 determining whether an entry condition of allowing an entry to a deterioration monitoring mode of the battery 100 is satisfied, setting the deterioration monitoring condition by operating the motor 300 when the entry condition of allowing the entry to the deterioration monitoring mode of the battery 100 is satisfied, performing charging of the battery 100 by operating the motor 300 after the setting the deterioration monitoring condition is completed, and stopping the charging and determining a deterioration rate when the state of charge (SOC) value of the battery 100 is greater than a predetermined first reference value as a result of the performing the charging.

The battery 100 may be a high-voltage battery that supplies electric power to the motor 300 of the vehicle.

The motor 300 is operated in a response to the command signal from the controller 500 when the battery 100 is charged and discharged to set the deterioration monitoring condition of the battery 100 or when the battery 100 is charged after the setting of the deterioration monitoring condition is completed.

The controller 500 determines whether the entry condition of allowing the entry to the deterioration monitoring mode of the battery 100 is satisfied, sets the deterioration monitoring condition by operating the motor 300 when the entry condition of allowing the entry to the deterioration monitoring mode of the battery 100 is satisfied, and performs the charging of the battery 100 by operating the motor 300 after the setting the deterioration monitoring condition is completed. As such, the controller 500 stops the charging and determines the deterioration rate when the SOC of the battery 100 is greater than the predetermined first reference value as a result of the performing the charging, and deletes a pre-stored deterioration rate of the battery 100 and stores the determined deterioration rate.

The detailed control process of the controller 500 will be described below with reference to a control method of monitoring deterioration of a battery of a vehicle.

Referring to FIG. 2 and FIG. 3, a control method of monitoring deterioration of a battery of a vehicle according to an exemplary embodiment of the present invention may include: determining whether an entry condition of allowing an entry to a deterioration monitoring mode of the battery is satisfied (S100); setting a deterioration monitoring condition when the entry condition of allowing the entry to the deterioration monitoring mode of the battery is satisfied (S200); performing charging of the battery after the setting the deterioration monitoring condition is completed (S300); and stopping the charging and determining a deterioration rate when the state of charge (SOC) value of the battery is greater than a predetermined first reference value as a result of the performing the charging (S400).

In the determining whether the entry condition of allowing the entry to the deterioration monitoring mode of the battery is satisfied (S100), it is determined whether the entry condition of allowing the entry to the deterioration monitoring mode is satisfied when a predetermined time elapses from a previous deterioration monitoring mode entry point. After deterioration monitoring is performed, a required time for the previously performed deterioration monitoring is counted, and deterioration monitoring is performed upon elapse of the predetermined time, whereby it is possible to update deterioration information periodically.

When a point at which the deterioration monitoring is required is reached, the controller receives a deterioration monitoring cooperative control execution entry signal and determines whether performing of the deterioration monitoring is possible in a current driving mode of a vehicle as the entry condition of allowing the entry to the deterioration monitoring mode of the battery. In detail, it is determined whether a driving mode of a vehicle is a driving mode requiring a high output (S120). When the driving mode of the vehicle is the driving mode requiring the high output such as an uphill mode, the deterioration monitoring is impossible, and therefore the deterioration monitoring mode is not entered. In the instant case, the deterioration monitoring mode may be entered due to charge and discharge control by the motor for a predetermined time period after IG-OFF.

When the entry condition of allowing the entry to the deterioration monitoring mode of the battery is satisfied, the deterioration monitoring mode is entered (S120), and the deterioration monitoring condition is set (S200).

Herein, the setting the deterioration monitoring condition is to determine whether the state of charge (SOC) value of the battery is equal to a second reference value (S210), to discharge the battery by operating the motor when the SOC of the battery is greater than the second reference value (S230), and to charge the battery by operating the motor when the SOC of the battery is less than the second reference value (240), such that the SOC of the battery becomes equal to the second reference value. As described above, due to performing of charging and discharging by use of the motor, the entry condition for performing the deterioration monitoring may be set without limitations.

The second reference value denotes state of charge (SOC) when the deterioration monitoring is possible, and is a value which may be variable depending on the settings.

In the performing the charging of the battery after the setting the deterioration monitoring condition is completed (S300), a required charge current value required in a current battery state is derived based on map data prepared in advance, and the charging of the battery is performed based on the derived required charge current value.

Herein, the map data is stored in the controller, and may include the required charge current value as output information and the battery state such as temperature of the battery, etc, as input information.

When the charging of the battery is performed, the motor is operated to perform constant current charging. Thus, the charging of the battery is performed by use of the motor, whereby the deterioration monitoring is possible without provision of an external charging device.

In the determining the deterioration rate (S400), the SOC of the battery is monitored during the charging of the battery and the SOC of the battery is compared with the predetermined first reference value (S410).

Herein, the first reference value denotes state of charge (SOC) when the deterioration monitoring is completed, and is a value which may be variable depending on the settings.

When the SOC of the battery is greater than the predetermined first reference value, charging is stopped and the deterioration rate is determined using acquired data (S420 and S430).

Herein, the deterioration rate is determined based on the map data including the deterioration rate as the output information and including the temperature and the SOC of the battery, which are the acquired data, as the input information. The map data is stored in the controller.

After the determining the deterioration rate (S430), a pre-stored deterioration rate of the battery is deleted and the determined deterioration rate is stored (S500). Thus, it is possible to update the deterioration rate without external charging when replacing a high-voltage battery or a battery management system (BMS) after mass production.

As described above, in the control method and system for monitoring the deterioration of the battery of the vehicle according to the various embodiments of the present invention, the deterioration monitoring is possible without provision of the external charging device due to performing of charging and discharging by use of the motor, and the entry condition for performing the deterioration monitoring may be set without limitations.

Furthermore, the charge current is adjusted according to the battery SOC, whereby it is possible to improve degree of freedom in deterioration monitoring.

Moreover, it is possible to update the deterioration rate without external charging when replacing the high-voltage battery or the battery management system (BMS) after mass production For convenience in explanation and accurate definition in the appended claims, the terms "upper", "lower", "internal", "outer", "up", "down", "upper", "lower", "upwards", "downwards", "front", "rear", "back", "inside", "outside", "inwardly", "outwardly", "internal", "external", "internal", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A control method of monitoring deterioration of a battery of a vehicle, the control method comprising:
   determining, by a controller, whether an entry condition of allowing an entry to a deterioration monitoring mode of the battery is satisfied;
   setting, by the controller, a deterioration monitoring condition when the entry condition of allowing the entry to the deterioration monitoring mode of the battery is satisfied;
   performing, by the controller, charging of the battery after the setting of the deterioration monitoring condition is completed; and
   stopping, by the controller, the charging and determining a deterioration rate of the battery when a first state of charge (SOC) value of the battery is greater than a predetermined first reference value as a result of the performing the charging,
   wherein in the determining of whether the entry condition of allowing the entry to the deterioration monitoring mode of the battery is satisfied, the controller is configured to determine whether a driving mode of the vehicle is a mode, in which the vehicle requires an output higher than a predetermined output.

2. The control method of claim 1, wherein in the determining of whether the entry condition of allowing the entry to the deterioration monitoring mode of the battery is satisfied, when a predetermined time elapses from a previous deterioration monitoring mode entry point, it is determined whether the entry condition of allowing the entry to the deterioration monitoring mode is satisfied.

3. The control method of claim 1, wherein in the setting of the deterioration monitoring condition, the battery is charged or discharged such that a second state of charge (SOC) value of the battery becomes equal to a second SOC reference value.

4. The control method of claim 3, wherein, when the second SOC value of the battery is not equal to the second SOC reference value, the setting of the deterioration monitoring condition includes:
   discharging the battery when the second SOC value of the battery is greater than the second SOC reference value; and
   charging the battery when the second SOC value of the battery is less than the second SOC reference value.

5. The control method of claim 1, wherein the charging of the battery is stopped by the controller and the deterioration rate of the battery is determined when the first SOC value monitored during the charging of the battery is greater than the predetermined first SOC reference value.

6. The control method of claim 3, wherein the battery is charged and discharged by operating a motor.

7. The control method of claim 1, wherein in performing the charging of the battery, a required charge current value required in a current battery state is derived based on map data prepared in advance, and the charging of the battery is performed based on the derived required charge current value.

8. The control method of claim 7, wherein the battery is charged by operating a motor.

9. The control method of claim 1, wherein in the determining the deterioration rate, the deterioration rate of the battery is determined based on map data prepared in advance, the map data including the deterioration rate as output information and temperature and a state of charge (SOC) of the battery as input information.

10. The control method of claim 1, further including:
    deleting a pre-stored deterioration rate of the battery and storing the determined deterioration rate after the determining the deterioration rate.

11. A control system for monitoring deterioration of a battery of a vehicle, the control system comprising:
    the battery mounted in the vehicle and supplying electric power to a motor of the vehicle;
    the motor operated in a response to a command signal from a controller when the battery is charged and discharged when a deterioration monitoring condition of the battery is set or when the battery is charged after the setting of the deterioration monitoring condition is completed; and
    the controller configured for determining whether an entry condition of allowing an entry to a deterioration monitoring mode of the battery is satisfied, setting the deterioration monitoring condition by operating the motor when the entry condition of the deterioration monitoring mode of the battery is satisfied, performing charging of the battery by operating the motor after the setting of the deterioration monitoring condition is completed, and stopping the charging and determining a deterioration rate when a first state of charge (SOC) value of the battery is greater than a predetermined first reference value as a result of the performing the charging,
    wherein in the determining of whether the entry condition of allowing the entry to the deterioration monitoring mode of the battery is satisfied, the controller is configured to determine whether a driving mode of the vehicle is a mode, in which the vehicle requires an output higher than a predetermined output.

12. The control system of claim 11, wherein, in setting the deterioration monitoring condition, when a second SOC value of the battery is not equal to a second SOC reference value,
    the controller is configured to discharge the battery when the second SOC value of the battery is greater than the second SOC reference value; and
    the controller is configured to charge the battery when the second SOC value of the battery is less than the second SOC reference value.

13. The control method of claim 11, wherein, in stopping the charging, the charging of the battery is stopped by the controller and the deterioration rate of the battery is determined when the first SOC value monitored during the charging of the battery is greater than the predetermined first SOC reference value.

14. The control system of claim 11, wherein, after determining the deterioration rate, the controller deletes a pre-stored deterioration rate of the battery and stores the determined deterioration rate.

* * * * *